United States Patent [19]

Okabe et al.

[11] 3,745,479

[45] July 10, 1973

[54] MICROWAVE OSCILLATOR STRUCTURE FOR PARALLEL OPERATION OF SOLID-STATE DIODES

[75] Inventors: Takahiro Okabe; Shigenobu Shinohara, both of Hamamatsu, Japan

[73] Assignee: President Shizuoka University, Shizuoka, Japan

[22] Filed: Jan. 17, 1972

[21] Appl. No.: 218,267

[30] Foreign Application Priority Data

Jan. 18, 1971 Japan .................................. 46/1304

[52] U.S. Cl. ........................ 331/56, 331/96, 331/99, 331/107 R, 333/82 B

[51] Int. Cl. .............................................. H03b 7/14

[58] Field of Search ................. 331/56, 96, 99, 100, 331/107 R, 107 G, 107 T; 333/82 B

[56] References Cited

UNITED STATES PATENTS

| | | | |
|---|---|---|---|
| 3,659,223 | 4/1972 | Mawhinney | 31/56 X |
| 3,491,310 | 1/1970 | Hines | 331/96 |

*Primary Examiner*—Roy Lake
*Assistant Examiner*—Siegfried H. Grimm
*Attorney*—I. Irving Silverman, Gerald R. Hibnick et al.

[57] ABSTRACT

A solid-state oscillator circuit suitable for parallel operation of the diodes comprising a waveguide and at least two parallel-plate resonators provided in the waveguide. Respective diode for the parallel plate resonator is mounted at a selected location for producing desired oscillation frequency. Bias potential is applied to each diode for separate excitation.

4 Claims, 3 Drawing Figures

MICROWAVE OSCILLATOR STRUCTURE FOR PARALLEL OPERATION OF SOLID-STATE DIODES

BACKGROUND OF THE INVENTION

1. Field of the Invention

The present invention relates to a solid-state oscillator circuit suitable for parallel operation, more especially to a high-frequency oscillator using a waveguide and diodes.

2. Description of the Prior Art

Known type solid-state oscillator circuit comprises a metal post in a waveguide and a plurality of diodes are mounted in the waveguide at a space between the tip of the metal post and wall of the waveguide. In such a known construction, it is necessary to select the characteristics of the diodes to be as same as possible for obtaining a high efficiency in parallel operation, because the diodes are mounted in a same space. Usually the characteristics of diodes show considerable deviation, such selection of diodes makes the total cost of the oscillator high. Also the bias potential is applied to the oscillator common to the plurality of diodes, so that an optimum excitation is difficult.

SUMMARY OF THE INVENTION

The present invention has for its object to mitigates above mentioned disadvantage of conventional solid-state oscillators particularly for the parallel operation.

According to the present invention a solid-state oscillator is realized by providing parallel-metal-plate resonators in a waveguide, and oscillation diodes are mounted onto the parallel-metal-plate resonators at a point suitable for the desired oscillation frequency so as to effect easy adjustment for the parallel-operating frequency.

BRIEF DESCRIPTION OF THE DRAWINGS

The invention will more fully be explained with reference to the accompanied drawings, in which.

DESCRIPTION OF THE PREFERRED EMBODIMENT

Figure 1:
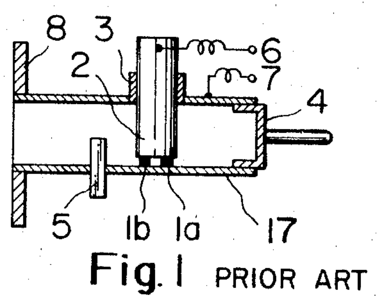
Fig. 1 PRIOR ART
FIG. 1 shows a schematic cross sectional view of a conventional waveguide oscillator for parallel operation.

FIG. 1 shows an embodiment of conventional solid-state oscillator using a plurality of diodes for parallel operation.

As shown in FIG. 1, two diodes 1*a* and 1*b* are mounted in a waveguide generally shown by 17. The diodes 1a and 1b are mounted inside the waveguide 17 between a metal post 2 and the inner wall. The metal post 2 is projected outside the waveguide 17 with an interposition of insulator 3 and connected with an electric bias supplying terminal 6. The bias potential is applied between the terminal 6 and another terminal 7 connected to an outer wall of the waveguide 17. The waveguide 17 further comprises a movable short circuit element 4, stub tuner 5 for matching and an output flange 8.

As explained already in such conventional construction, since two diodes 1a and 1b should be inserted between the metal post 2 and the wall of the waveguide 17, it has been difficult to operate the diodes in the optimum condition. Usually the characteristics of diodes show considerable deviation and the diodes having a similar characteristics should be chosen, which makes the manufacturing cost high.

Figure 2:
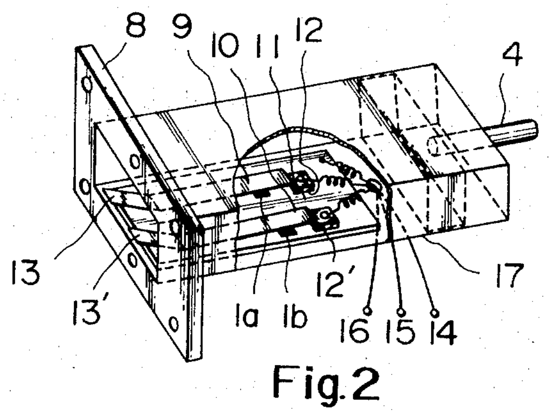
FIG. 2 is a perspective view of an embodiment of a solid-state oscillator according to the present invention.

FIG. 2 shows an embodiment of an oscillator made in accordance with the present invention.

In FIG. 2, a set of parallel-plate resonators which consist of a set of parallel metal plates 9, 11 and 10, 11 are provided in the waveguide 17. The metal plates 9 and 10 are mounted on the metal plate 11 with an interposition of insulators 12 and 12'. 13 and 13' show tapered portions of the metal plates 9 and 10. Bias terminals 14, 15 and 16 are connected to respective metal plates 9, 10 and 11. 4 is a movable short circuit element and 8 is an output flange of the waveguide.

According to the present invention, diodes 1*a* and 1*b* are mounted at a selected point along the length of parallel metal plate 9 or 10. By moving the mounting position of the diode, the oscillation frequency of the parallel-plate oscillator can be changed, accordingly, even if there is some difference in the characteristics of the two diodes the circuit can be adjusted to match desired oscillation frequency.

According to the present invention the bias voltage can be supplied to each of the diodes independently, so that a suitable bias current can be supplied to each diode. Furthermore by changing the taper angle of the tapered portion 13 or 13' of the metal plate 9 and 10, the coupling between the parallel-metal-plate oscillator and the wave-guide can be changed.

The above mentioned couple of adjustments can be performed laying the sets of oscillators outside the waveguide 17, accordingly the adjustment is very easy. After the adjustment, the sets of oscillators can be inserted in the waveguide and by adjusting the movable short circuit element 4, a maximum oscillation output can be obtained.

Figure 3:
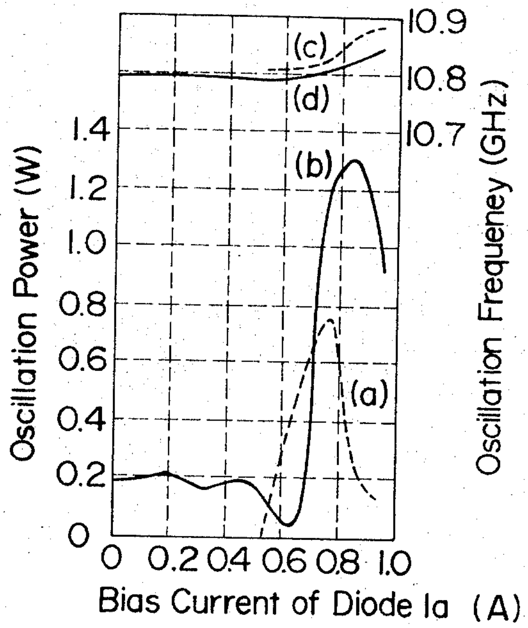
FIG. 3 is a graph illustrating oscillation characteristics of solid-state oscillator comprising two diodes according to the present invention.

FIG. 3 shows a graph of result of experiments made by mounting two avalanche diodes 1*a* and 1*b* in the circuit shown in FIG. 2. At first only the diode 1a is mounted on the circuit shown in FIG. 2. After making adjustment for obtaining maximum power in the neighborhood of desired oscillation frequency of 10.83 GHz and then the bias voltage of the diode 1a is changed. The oscillation power is shown by dotted line curve *a* and the oscillation frequency is shown by a dotted line curve *c*. Then another diode 1*b* is mounted on the circuit and by adjusting the bias current for the diode 1*b* and the mounting location of the diode 1*b* to be suitable value for the desired oscillation frequency, the synchronizing oscillation of the two diodes can be obtained. When fixing the mounting location of diodes 1*a* and 1*b* and also the bias current of the diode 1*b* to match the most suitable value of 0.55 W at 10.83 GHz, and only bias current of the diode 1a is changed. The oscillation power is shown by curve *b* and the oscillation frequency of the oscillator is given by curve *d*.

As is clearly shown by FIG. 3, the maximum oscillation power of the oscillator at the parallel operation of the diodes 1a and 1b at the desired frequency of 10.83 GHz is 1.3 W, which is a sum of maximum output power 0.75 W of diode 1*a* only and that 0.55 W of diode 1*b* only.

The present invention was explained by taking as an example for a case of using two avalanche diodes, but the invention is not limited for such application of two avalanche diodes only and can equally be applied for a case of parallel operation of a plurality of diodes.

When solid-state oscillation elements such as avalanche diodes are mounted in a circuit according to the present invention, it is possible to operate each constructive element in an optimum condition for the oscillation. Therefore an output can be obtained as a sum of maximum output power of each oscillation element oscillating at the desired frequency.

According to the present invention a great flexibility for the selection of diodes can be obtained so that a reduction for the manufacturing cost can be attained.

We claim:

1. A microwave oscillator structure for parallel operation of a plurality of solid-state diodes, comprising: a rectangular waveguide that defines a cavity which is open at one end; at least two resonators mounted entirely within said cavity, each said resonator being constructed of a pair of substantially parallel metal plates electrically insulated from one another, said plates being oriented parallel to the longitudinal axis of the waveguide, a solid-state diode being mounted between the parallel plates of each said resonator and at a position relative to its resonator plates to define for all said resonators the same oscillating frequency, each resonator being constructed to receive separate and different biasing potential for maximizing the total power output of said oscillator structure.

2. A microwave oscillator structure according to claim 1 in which one of said pair of plates of each resonator defines a base plate common to a plurality of said resonators, and said base plate is insulated electrically from the other of said parallel plates of all said resonators.

3. A microwave oscillator structure according to claim 1 in which one plate of each of said pair of plates of each of said resonators has a free end which lies proximate to the open end of said cavity, and said free end is constructed for regulating positioning transverse to the planes of the plates to effect control over the amount of coupling between each resonator and the waveguide.

4. A microwave oscillator structure according to claim 3 in which said free end normally is bent at an angle of taper upward from the parallel planes of said plates.

* * * * *